(12) United States Patent
Dixon et al.

(10) Patent No.: US 7,486,585 B2
(45) Date of Patent: *Feb. 3, 2009

(54) SECURING AN INTEGRATED CIRCUIT

(75) Inventors: Robert C. Dixon, Austin, TX (US); Kirk E. Morrow, Round Rock, TX (US); Phil C. F. Paone, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/875,971

(22) Filed: Oct. 22, 2007

(65) Prior Publication Data

US 2008/0043558 A1   Feb. 21, 2008

Related U.S. Application Data

(63) Continuation of application No. 11/381,837, filed on May 5, 2006, now Pat. No. 7,321,522.

(51) Int. Cl.
*G11C 17/18* (2006.01)

(52) U.S. Cl. .............................. 365/225.7; 365/185.04; 365/201

(58) Field of Classification Search .............. 365/225.7, 365/185.04, 201, 207
See application file for complete search history.

(56) References Cited

U.S. PATENT DOCUMENTS 7,321,522 B2 *  1/2008  Dixon et al. ............. 365/225.7

* cited by examiner

*Primary Examiner*—Anh Phung
*Assistant Examiner*—Toan Le
(74) *Attorney, Agent, or Firm*—Biggers & Ohanian, LLP

(57) ABSTRACT

Securing an integrated circuit, including fabricating the integrated circuit so that the integrated circuit includes at least one efuse that is intended to be always blown during operation of the integrated circuit and the integrated circuit includes security circuitry capable of blowing the efuse and of performing other security related functions; blowing, by the security circuitry of the integrated circuit, the efuse when power is applied to the integrated circuit and prior to performing any other security related functions; and setting, by the security circuitry after blowing the efuse, a security state of the integrated circuit in dependence upon a sensed state of the efuse.

12 Claims, 5 Drawing Sheets

SECURING AN INTEGRATED CIRCUIT

CROSS-REFERENCE TO RELATED APPLICATION

This application is a continuation application of and claims priority from U.S. patent application Ser. No. 11/381,837, filed on May 5, 2006.

BACKGROUND OF THE INVENTION

1. Field of the Invention

The field of the invention is data processing, or, more specifically, methods and apparatus for securing an integrated circuit.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One area of computer technology that has seen rapid advancement is the use of electronic fuses ('efuses') to manufacture integrated circuits that can reconfigure themselves automatically. An efuse is an element of an integrated circuit designed to undergo electromigration when exposed to a certain level of programming voltage and change the resistance of the circuit element from a low resistance to a high resistance, allowing a sensing circuit to sense the element as 'on,' 'programmed,' or 'blown.' During the life cycle of an integrated circuit, unblown efuses may be blown to configure and control access to scan circuitry and operational logic of an integrated circuit, for example. Efuses are used to configure integrated circuits after the silicon masking and fabrication process. Efuses may be used to configure customizable circuits or to correct silicon manufacturing defects and increase manufacturing yield.

Efuses can also be used to create test modes for an entire integrated circuit that customize the testability of an integrated circuit as it goes through the various stages of manufacturing. For some applications such as microprocessors it may be desirable to have various modes of operations. These modes may include various secure and non-secure states. By controlling clocks and mux selects, entire portions of an integrated circuit can be turned on and off depending on the integrated circuit's security state. After bring-up and testing is complete, secure information would only be readable during the normal operation of the integrated circuit and is unreadable to the outside world. More importantly the state of the outputs of a secure memory could not be scanned by an attacker or hacker who has forced the integrated circuit into test mode.

It may be possible for a hacker to attempting to defeat a security mechanism implemented by the efuses to alter the operating environment in such a way that the circuitry that senses efuses values does not operate correctly. Such environmental changes will usually affect most or all of the efuses on a given integrated circuit and would cause efuses that have actually been blown to appear to be unblown. If successful, the attacker would then have the same access to the integrated circuit is if the integrated circuit just came out of fabrication and all fuses are not blown.

Due to the fact that an integrated circuit is initially fabricated in a non-secure state it is general practice to equate an efuse's unblown state with a non-secure system state. In order to prevent environmental changes that make all efuses to appear unblown from unlocking a secured integrated circuit, it could instead be considered an invalid state. One or more efuses that should be always blown for all circumstances can then be used to set the integrated circuit in an invalid mode and block access if sensed as unblown. The difficulty with this is that all efuses are unblown at the end of fabrication and the integrated circuit would be locked before any fuses can be blown. One currently used way around this is through the use of a wafer-only pin ('WOP'). During wafer testing, a WOP is accessible that can be driven high to the same logic that detects the always blown efuse(s) causing the always blown efuse(s) to appear to be blown. This allows access to the integrated circuit to burn the always burned efuse(s). When the integrated circuit die is packaged, this WOP is tied low and not brought out from the die to a package pin.

There are substantial disadvantages to the use of a WOP, however. In integrated circuit design, adding any circuit element adds expense, especially a circuit element that requires a conductive pathway to a circuit pad and an outside connection. In addition, test drive patterns must be made more complex and therefore more expensive in order to drive the additional enabling signals through the WOP.

SUMMARY OF THE INVENTION

Methods and apparatus are disclosed for securing an integrated circuit that include fabricating the integrated circuit so that the integrated circuit includes at least one efuse that is intended to be always blown during operation of the integrated circuit and the integrated circuit includes security circuitry capable of blowing the efuse and of performing other security related functions; blowing, by the security circuitry of the integrated circuit, the efuse when power is applied to the integrated circuit and prior to performing any other security related functions; and setting, by the security circuitry after blowing the efuse, a security state of the integrated circuit in dependence upon a sensed state of the efuse.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 1 also illustrates an example of an efuse blowing circuit for programming or 'blowing' an efuse in apparatus that secures integrated circuits according to embodiments of the present invention.

DETAILED DESCRIPTION OF EXEMPLARY EMBODIMENTS

Figure 1:
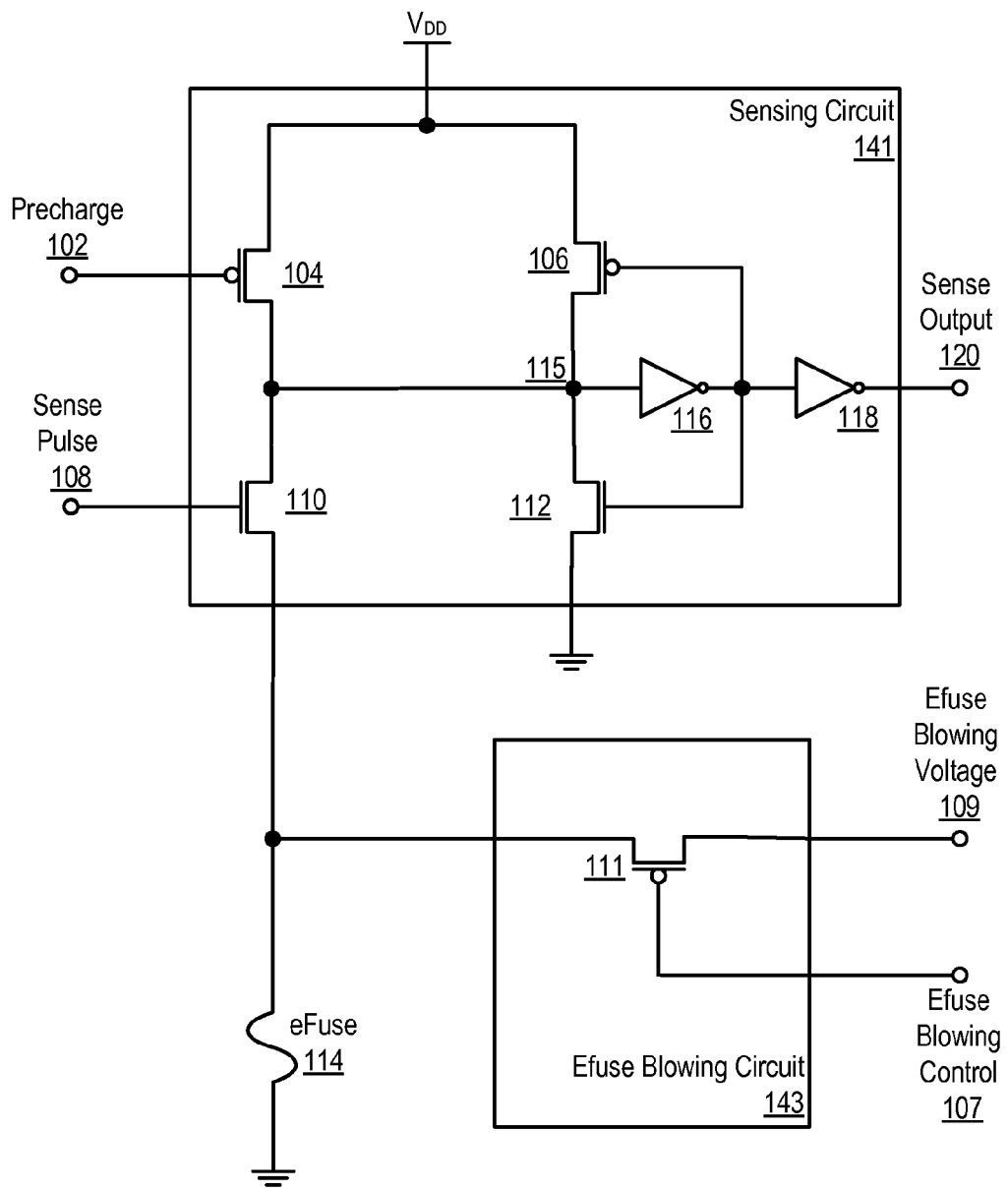
FIG. 1 sets forth a line drawing illustrating an example of a sensing circuit for sensing the state of an efuse in apparatus that secure integrated circuits according to embodiments of the present invention.

Exemplary methods and apparatus for securing an integrated circuit according to embodiments of the present invention are described with reference to the accompanying drawings, beginning with FIG. 1. FIG. 1 sets forth a line drawing illustrating an example of a sensing circuit (141) for sensing the state of an efuse in apparatus that secure integrated circuits according to embodiments of the present invention. FIG. 1 also illustrates an example of an efuse blowing circuit (143) for programming or 'blowing' an efuse in apparatus that secures integrated circuits according to embodiments of the present invention.

Electromigration fuses or 'efuses' do not create a complete open in the circuit like a conventional fuse, but rather create a higher resistance connection. The actual resistance values of the efuses are technology dependant. However, a blown efuse element may typically have a resistance 15× or more greater than that of an unblown efuse. The sensing circuit that detects the efuse value as blown or unblown is timed with a sense pulse to detect the efuse state appropriately.

In the example of FIG. 1, in an initial state of the sensing circuit, precharge input (102) is deasserted or set to 1, and sense pulse input (108) is also deasserted or set to 0. When a sense operation is to occur, security circuitry or a state machine of the security circuitry first asserts precharge input (102) by setting it to 0. This turns on the connected PMOS transistor (104) which forces the input to inverter (116) high. This will cause the output of inverter (116) to be 0 at which point the input (115) to inverter (116) is now also pulled high through the second PMOS transistor (106).

Then the security circuitry or state machine will apply a sense pulse to the sense pulse input (108), first asserting the sense pulse input by setting it to 1 while deasserting the precharge input by setting it back to 1, then some pulse duration later, deasserting the sense input by setting it back to 0. When the security circuitry or state machine asserts the sense pulse input (108) by setting it to 1 and deasserts the precharge input (102) by setting it back to 1, this turns on the efuse sense NMOS transistor (110) and shuts off the precharge PMOS transistor (104). The input (115) to inverter (116), which has been precharged, now sees a connection to ground through the efuse (114).

If the resistance of the efuse is small, because the efuse is unblown, the efuse will pull enough current during the sense pulse to drop the voltage on the input (115) of inverter (116) down to 0, and the output of inverter (116) goes to 1. At that point, the feedback transistors (106, 112) will change state, so that the NMOS transistor (112) is on and the PMOS transistor (106) is off maintaining a connection to ground. At this point the efuse has been sensed as unblown and the sense output (120) will be 0. For blown efuses, the resistance across the efuse is sufficient to prevent input (115) to inverter (116) from dropping past the switch point of the feedback transistors (106, 112) during the sense pulse, and when the sense pulse input (108) deasserts, the sense circuit will maintain state with the value of the sense output (120) being 1.

Integrated circuits are secured according to embodiments of the present invention by use of at least one efuse that is intended to be always blown during operation of the integrated circuit. Such an efuse is often referred to in this specification as an 'always-blown efuse'. The term refers to an efuse's intended use; always-blown efuses are not literally always blown because they typically are manufactured in an unblown state and blown during fabrication test. In addition, always-blown efuses may not always be sensed as blown even after they are blown in fabrication test. An attacker can underclock the sense pulse input (110) or otherwise alter the operating environment of the circuit and artificially cause the always-blown efuse to be falsely sensed as unblown.

If the sense pulse is artificially extended, or if other environmental conditions are artificially modified by an attacker, despite the high resistance of the always-blown efuse, the always-blown efuse may pull enough current during the sense pulse to drop the voltage on the input (115) of inverter (116) down to 0, and the output of inverter (116) will then go to 1. At that point, the feedback transistors (106, 112) will change state, so that the NMOS transistor (112) is on and the PMOS transistor (106) is off maintaining a connection to ground. At this point the always-blown efuse has been falsely sensed as unblown and the sense output (120) will be 0.

The example circuit of FIG. 1 includes an example of an efuse blowing circuit (143) for programming or 'blowing' an efuse in apparatus that secures integrated circuits according to embodiments of the present invention. In integrated circuits that are secured according to embodiments of the present invention, a security circuit blows at least one always-blown efuse when power is applied to the integrated circuit and prior to performing any other security related functions. A security circuit may blow efuse (114) by asserting the efuse blowing control input (107) by driving it low, thereby turning on the efuse blowing transistor (111) and applying the efuse blowing voltage (109) to the efuse (114).

In some embodiments of the present invention, the security circuit simply blows the efuse that is intended to be always blown during operation of the integrated circuit every time that power is applied to the integrated circuit. Such embodiments then typically apply a security check by sensing the state of the always-blown efuse. If the always-blown efuse senses as unblown, the security circuit infers that the integrated circuit is under attack and places the integrated circuit in a blocked security state, blocking all access to operational logic and scan functions of the integrated circuit.

The efuse blowing voltage (109) is high enough to drive sufficient current through the efuse (114) to cause electromigration and blow the efuse (114). The efuse blowing voltage (109) may need to be higher than the normal supply voltage on the integrated circuit, may be provided from an additional external power supply, and may in fact be applied to the integrated circuit only during manufacturing or test procedures. If the efuse blowing voltage (109) is not present the very first time the integrated circuit is powered up, an always-blown efuse will remain unblown, a security check will lock the integrated circuit, place it in blocked security state, and prevent further operation of the integrated circuit. The first time such an integrated circuit is powered up with efuse blowing voltage (109) present, the always-blown efuse will be blown, the integrated circuit will pass its security check, and the security circuit will place the integrated circuit in fabrication test security state with full access to all operational logic and scan functions. During subsequent normal operations when the efuse blowing voltage is not present, a security circuit that blows always-blown efuses every time the integrated circuit is powered up will attempt to blow the always-blown efuse by asserting efuse blowing control (107) and fail because there is no available efuse blowing voltage (109), and such failure will have no effect because the always-blown efuse was already blown when the integrated circuit was first power up on fabrication test with efuse blowing voltage (109) applied.

The arrangement of transistors, inverters, and other circuit elements in the example circuit of FIG. 1 is for explanation, not for limitation. Other forms of sensing circuitry and efuse blowing circuitry may be used by security circuitry or state machines of an integrated circuit to read the state of an efuse or to blow an efuse in apparatus that secure integrated circuits according to embodiments of the present invention, and all such forms of sensing circuit and blowing circuit are well within the scope of the present invention.

Figure 2:
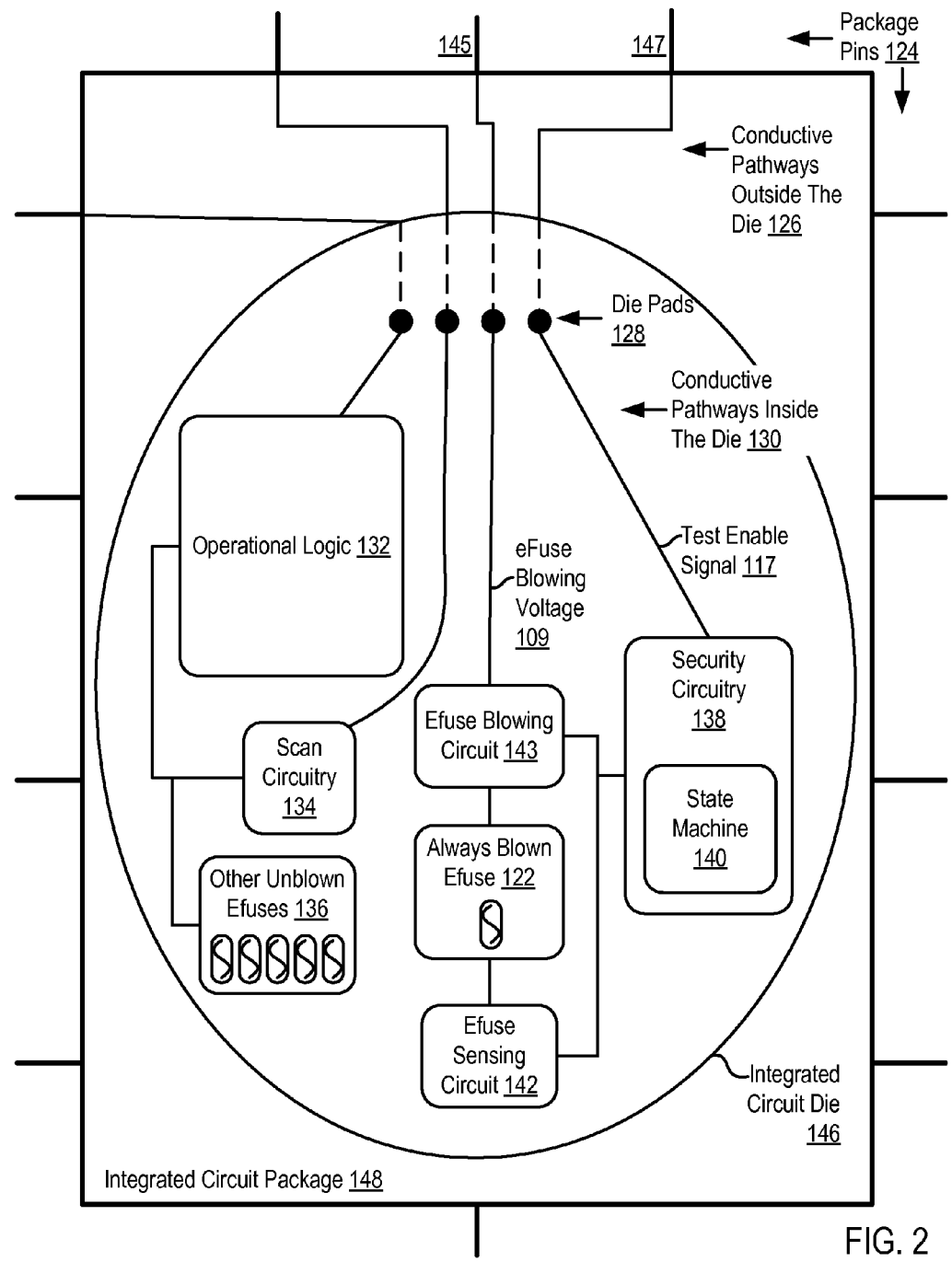
FIG. 2 sets forth a functional block diagram of an example integrated circuit that is secured according to embodiments of the present invention.

For further explanation, FIG. 2 sets forth a functional block diagram of an example integrated circuit that is secured according to embodiments of the present invention. The overall physical structure of the integrated circuit of FIG. 2 is implemented as an integrated circuit die (146) installed in an integrated circuit package (148). The integrated circuit of FIG. 2 includes conductive pathways (130) inside the die (146) connected through die pads (128) and conductive pathways (126) outside the die but inside the package (148) to package pins (124). The placement of the die in the package in the example of FIG. 2 is for explanation of the overall physical structure of an integrated circuit. An integrated circuit having the illustrated configuration is ready for shipment to an OEM or for installation in an electronic product. Readers will recognize, however, that the die is fabricated on a wafer with many other dice and sawed from the wafer during fabrication. The very first application of power to the integrated circuit typically occurs during fabrication test, before the die is packaged, and typically even before the die is sawn from the wafer.

The integrated circuit of FIG. 2 includes operational logic (132), the general functional circuitry of the integrated circuit, the circuitry that carries out the work that the integrated circuit is intended for, computer memory, computer processor logic, and so on, for example. The operational logic (132) typically is composed of many transistors and other circuit elements making up many inverters, gates, latches, registers, or memory storage elements. The details of operational logic often are confidential or proprietary, a subject of integrated circuit security, intended for protection against attack.

The integrated circuit of FIG. 2 also includes scan circuitry (134). Scan circuitry is a test element of the integrated circuit. Scan circuitry typically operates in a serial, first-in first-out, mode to initialize elements of an integrated circuit for test and to read values from circuit elements during test stages, to confirm proper operation of an integrated circuit. One example of scan circuitry is boundary scan circuitry implemented according to the standards of the Joint Test Action Group ('JTAG'), although it is common for manufacturers of integrated circuits to implement sophisticated, proprietary scan circuitry also. Access to scan circuitry of an integrated circuit allows an attacker to learn details of the operational logic of the integrated circuit. Controlling access to scan circuitry therefore is both a subject of integrated circuit security and a tool of integrated circuit security.

The integrated circuit of FIG. 2 also includes a number of unblown efuses (136). As a practical matter, in an integrated circuit that uses efuses to configure and control access to scan circuitry and operational logic, there will be initially thousands of unblown efuses. During the life cycle of the integrated circuit, unblown efuses are blown to configure and control access to scan circuitry and operational logic.

The integrated circuit of FIG. 2 also includes at least one always-blown efuse (122), an efuse that is intended to be always blown during operation of the integrated circuit. As mentioned above, an always-blown efuse is fabricated unblown and then blown by a security circuit typically the first time that power is applied to the integrated circuit. As a practical matter, in an integrated circuit that uses always-blown efuses to secure the integrated circuit according to embodiments of the present invention, there may be, not merely one, but many always-blown efuses, depending on the application.

The integrated circuit of FIG. 2 also includes a sensing circuit (141) for sensing the state of the always-blown efuse (122) and a blowing circuit (143) for blowing the always-blown efuse (122), as well as a conductive pathway for applying an efuse blowing voltage (109) to the efuse blowing circuit (143) through package pin (145). Sensing circuit (141) is a circuit similar to the sensing circuit illustrated and described above with regard to FIG. 1, and blowing circuit (143) is a circuit similar to the blowing circuit illustrated and described above with regard to FIG. 1. For ease of explanation, only one sensing circuit and only one blowing circuit are shown in FIG. 2, although in actual practice, efuses are fabricated in cells with one sensing circuit and one blowing circuit for each efuse, so that when there are thousands of efuses in an integrated circuit, there are also thousands of sensing circuits and thousands of blowing circuits.

The integrated circuit of FIG. 2 also includes security circuitry (138) as well as a conductive pathway for connecting a test enable signal (117) through package pin (147) to security circuitry (138). At some life cycle stages of an integrated circuit, certain functions security related functions are activated only if a test enable signal is asserted. In some integrated circuits that are secured according to embodiments of the present invention, a security circuit will blowing an always-blown efuse only if a test enable signal like the on at reference (117) on FIG. 2 is asserted. Fabricating an integrated circuit to blown an always-blown efuse only in the presence of a test enable signal prevents repeatedly blowing or attempting to blow always-blown efuses every time the integrated circuit is powered up throughout its entire life cycle. Such an integrated circuit, however, is initially fabricated with all its efuses, including its always-blown efuses, unblown, and will not function in any way until at least one of its always-blown efuses is blown. At some point typically early in fabrication test, therefore, such an integrated circuit usefully is powered on with its test enable signal (117) asserted and with an efuse blowing voltage (109) applied.

Figure 3:
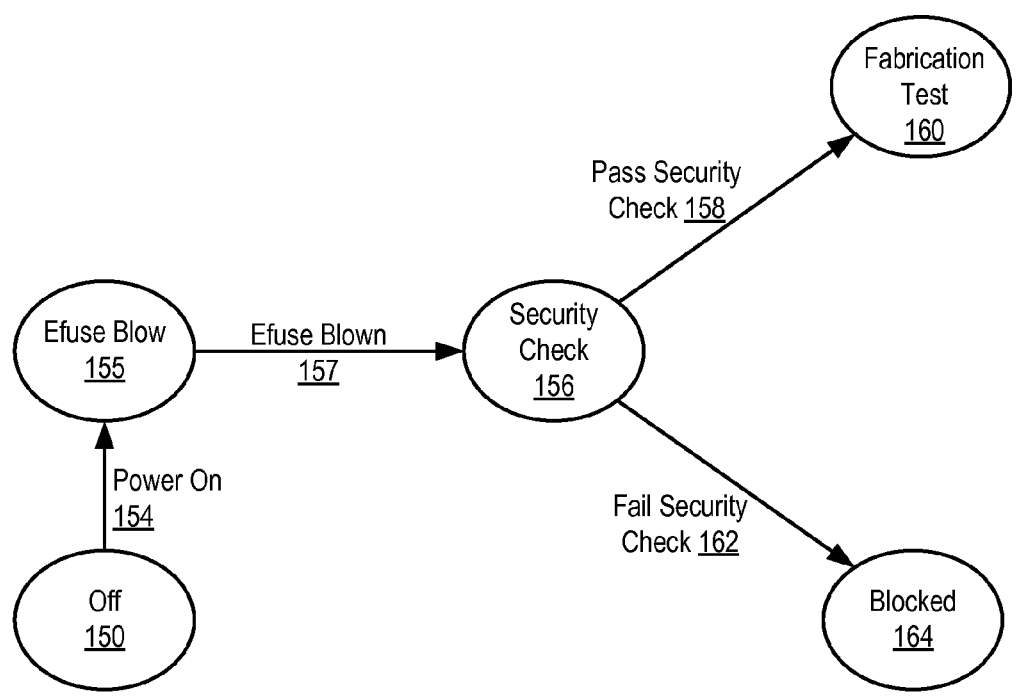
FIG. 3 sets forth a line drawing that illustrates an exemplary state machine that is useful at the fabrication test stage of an integrated circuit life cycle for securing an integrated circuit according to embodiments of the present invention.

The security circuitry (138) in the example of FIG. 2 implements a state machine (140) that operates as illustrated in FIG. 3. FIG. 3 sets forth a line drawing that illustrates an exemplary state machine that is useful at the fabrication test stage of an integrated circuit life cycle for securing an integrated circuit according to embodiments of the present invention. The integrated circuit comes from fabrication initially having never had power applied to it, in an off state (150). Applying power (154) to the integrated circuit sets the integrated circuit to an efuse blow state (155) in which the security circuitry blows at least one always-blown efuse prior to performing any other security related functions.

Blowing the always-blown efuse (157) sets the integrated circuit to a security check state (156) in which security circuitry reads a sensed state of the always-blown efuse from a sensing circuit and sets a security state of the integrated circuit in dependence upon the sensed state of the efuse. If the efuse is sensed as unblown, indicating that the integrated circuit is under attack, the integrated circuit fails the security check (162) and the security circuit transitions to a blocked security state (164) in which the integrated circuit ceases to function, stops its power up or boot processing, blocks all scan access, and locks down all operational logic on the integrated circuit. If the efuse is sensed as blown, indicating that the integrated circuit is not under attack, the integrated circuit passes the security check (158) and transitions to a fabrication test security state (160) in which all operational logic of the integrated circuit is functional and full scan access is granted.

The example of FIG. 3 illustrates four security states. In fact, integrated circuits secured according to embodiments of the present invention may have any number of security states, typically corresponding to stages in integrated circuit life cycle. The security states illustrated in FIG. 3 are appropriate to the fabrication stage of integrated circuit life cycle. Other security states may include for example an original equipment manufacturer ('OEM') security state, a normal operations security state, and a maintenance test security state.

During the life cycle of an integrated circuit, unblown efuses may be blown to configure and control access to scan circuitry and operational logic. Security related functions of security circuitry in such integrated circuits typically include a capability of setting a security state of the integrated circuit according to a life cycle of the integrated circuit in dependence upon whether other efuses are blown, that is, efuses other than the always-blown efuses. When an integrated circuit is shipped from its fabricator to an OEM for installation in electronic products, for example, the fabricator may blow efuses to exclude access to operational logic and scan circuitry considered confidential or proprietary to the fabricator, leaving sufficient access so that the OEM can configure the integrated circuit in a way appropriate to its use in various products. Similarly, the OEM may blow additional efuses to exclude all scan access during normal operation of the integrated circuit in a manufactured product in the hands of an end user—because ordinary users would typically have no need for internal access to operational logic or scan circuitry—and any attempt for such access during the normal operation life cycle stage may be viewed as a potential attack on the integrated circuit. If the integrated circuit fails or is damaged and returned to the OEM or fabricator for analysis or repair, the OEM or fabricator may blow additional efuses to return all or part of the scan access for further test of the integrated circuit.

Figure 4:
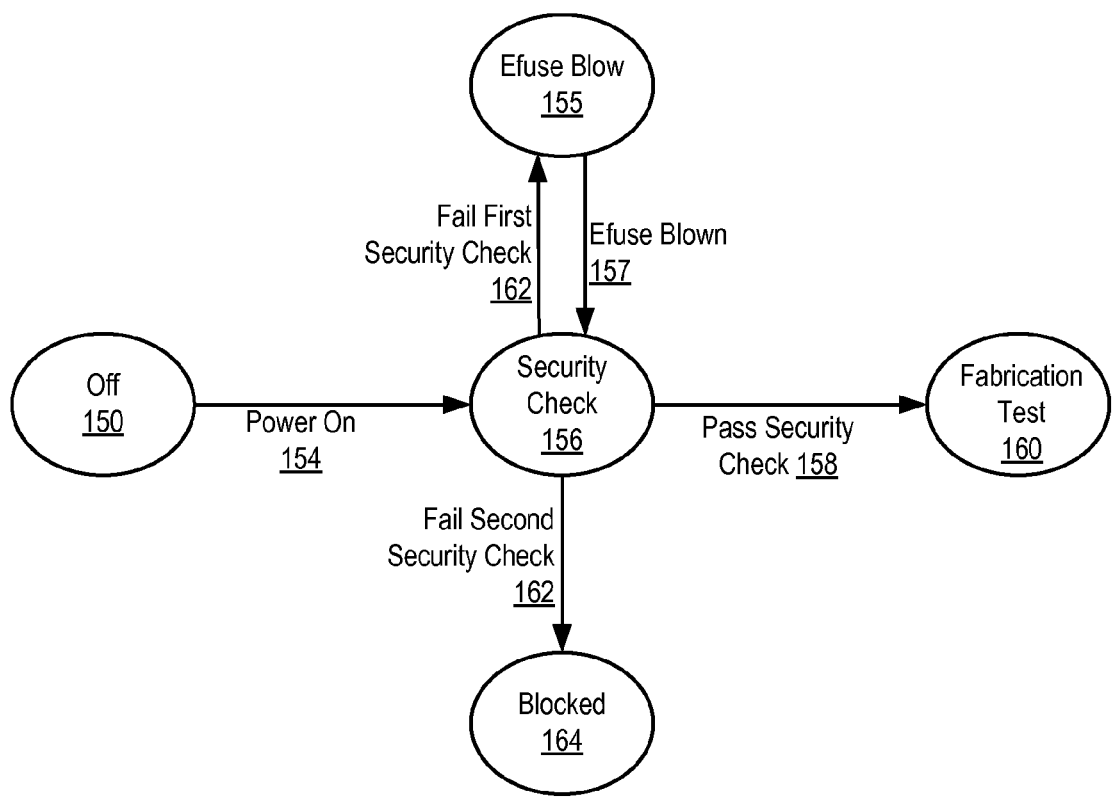
FIG. 4 sets forth a line drawing that illustrates a further exemplary state machine useful at the fabrication test stage of an integrated circuit life cycle for securing an integrated circuit according to embodiments of the present invention.

For further explanation, FIG. 4 sets forth a line drawing that illustrates a further exemplary state machine useful at the fabrication test stage of an integrated circuit life cycle for securing an integrated circuit according to embodiments of the present invention. The example state machine of FIG. 4 represents security circuit functionality that only blows an always-blown efuse if the always-blown efuse is sensed as unblown on power up.

The integrated circuit comes from fabrication, initially having never had power applied to it, in an off state (150). Applying power (154) to the integrated circuit in this example sets the integrated circuit to a security check state (156) in which security circuitry reads a sensed state of the always-blown efuse from a sensing circuit and sets a security state of the integrated circuit in dependence upon the sensed state of the efuse. If the always-blown efuse senses as unblown, the integrated circuit fails a first security check (162) and transitions to an efuse blow state (155) in which the security circuitry blows the always-blown efuse prior to performing any other security related functions. At this point in processing, it is unknown whether the integrated circuit is under attack; the always-blown efuse may be unblown in this example because the integrated circuit has never before been powered up. If the always-blown efuse sensed as unblown is in fact already blown and sensed as unblown because the circuit is under attack, then blowing it has no effect. If the always-blown efuse is sensed as unblown because it is in fact unblown, blowing it places it in the correct condition for further operation.

Blowing the always-blown efuse (157) returns the integrated circuit to the security check state (156) in which the security circuitry reads a sensed state of the always-blown efuse from a sensing circuit and sets a security state of the integrated circuit in dependence upon the sensed state of the efuse. Now that the security circuit has already blown the efuse, sensing the always-blown efuse as unblown definitely indicates a security risk. If the efuse is sensed as unblown, indicating that the integrated circuit is under attack, the integrated circuit fails the second security check (162) and the security circuit transitions to a blocked security state (164) in which the integrated circuit ceases to function, stops its power up or boot processing, blocks all scan access, and locks down all operational logic on the integrated circuit. If the efuse is sensed as blown, indicating correct function with no apparent security risk, the integrated circuit passes the security check (158) and transitions to a fabrication test security state (160) in which all operational logic of the integrated circuit is functional and full scan access is granted.

Figure 5:
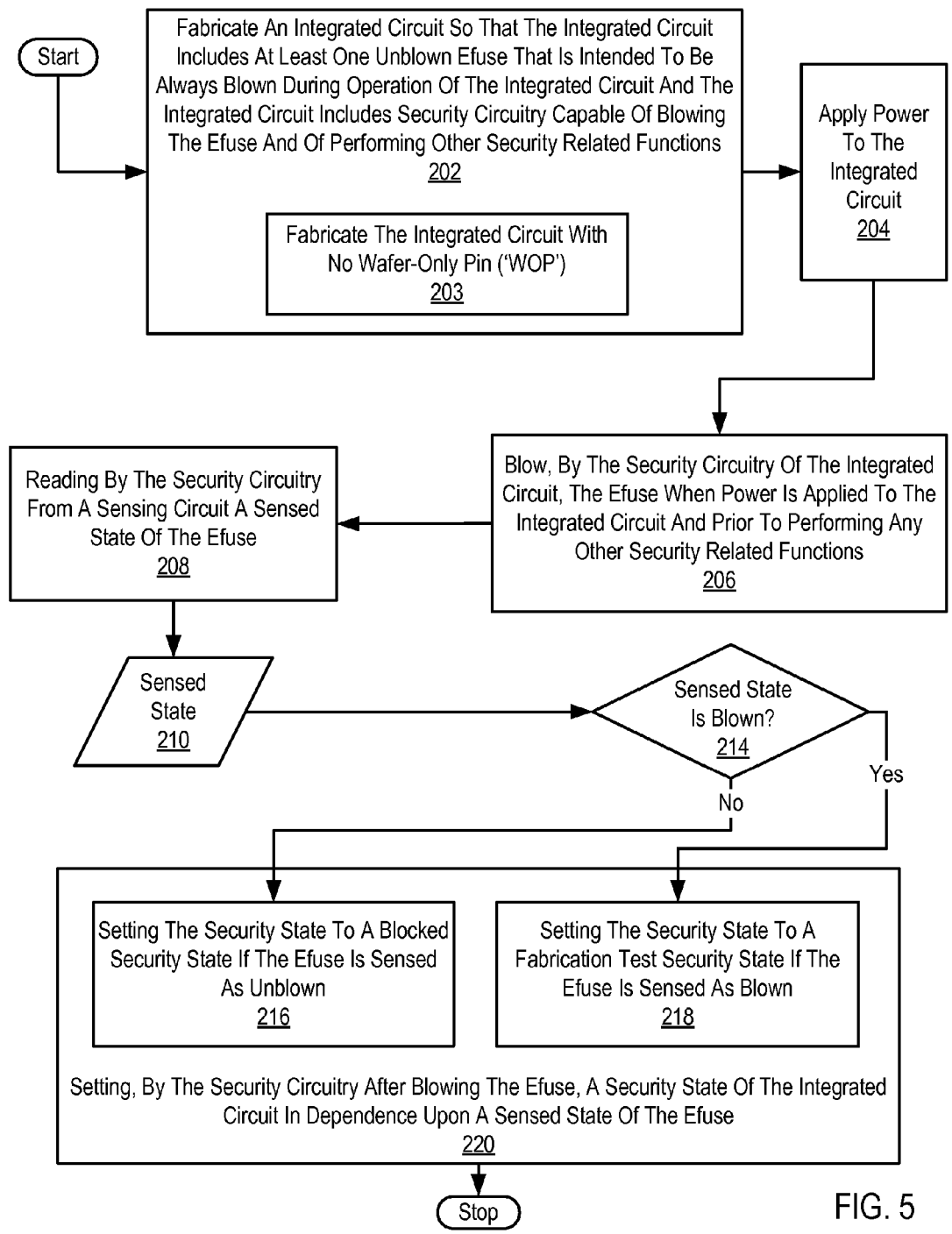
FIG. 5 sets forth a flow chart illustrating an exemplary method for securing an integrated circuit according to embodiments of the present invention.

For further explanation, FIG. 5 sets forth a flow chart illustrating an exemplary method for securing an integrated circuit according to embodiments of the present invention that includes fabricating (202) the integrated circuit so that the integrated circuit includes at least one efuse that is intended to be always blown during operation of the integrated circuit (an 'always-blown efuse') and the integrated circuit includes security circuitry capable of blowing the efuse and of performing other security related functions. In the method of FIG. 5, fabricating (202) the integrated circuit includes fabricating (203) the integrated circuit with no wafer-only pin ('WOP') to enable blowing the efuse after fabrication of the integrated circuit.

The method of FIG. 5 also includes blowing (206), by the security circuitry of the integrated circuit, the efuse when power is applied (204) to the integrated circuit and prior to performing any other security related functions. Blowing the efuse in some embodiments is carried out by blowing the efuse, or attempting to blow the efuse, every time power is applied to the integrated circuit throughout the entire life cycle of the integrated circuit. In at least some portions of the life cycle of the integrated circuit, no efuse blowing voltage may be applied to the integrated circuit, so that blowing the efuse with no efuse blowing voltage may be better described as an attempt. Blowing the efuse in some embodiments is carried out by blowing the efuse only if a test enable signal is asserted. Blowing the efuse in some embodiments is carried out by blowing the efuse only if the efuse is sensed as unblown.

The method of FIG. 5 also includes reading (208), by the security circuitry when power is applied to the integrated circuit, a sensed state (210) of the efuse from a sensing circuit. The method of FIG. 5 also includes determining (214) whether the sensed state of the efuse is blown or unblown and setting (220), by the security circuitry after blowing the efuse, a security state of the integrated circuit in dependence upon the sensed state of the efuse. In the method of FIG. 5, setting (220) a security state of the integrated circuit in dependence upon a sensed state of the efuse includes setting (218) the security state to a fabrication test security state if the efuse is sensed as blown and setting (216) the security state to a blocked security state if the efuse is sensed as unblown.

Securing an integrated circuit with always-blown efuses as described in this specification allows every integrated circuit that uses efuses to have efuses that are intended to be always blown during integrated circuit operation that are actually always blown during integrated circuit operation, even on the very first power up of the integrated circuit, in fact, particularly whenever power is first applied to an integrated circuit, and with no need for special pins or test procedures to blow the always-blown efuses. Such always-blown efuses along with other unblown efuses can now be used to detect any attempts to override the normal efuse sensing operations—even if an integrated circuit is stolen from a fabricator and attacked by hackers on first power up. The always-blown efuses allow detection of any manipulation of the operating environment of an integrated circuit, temperature or clock speed, for example, that may cause all efuses to sense all zeros, and unblown efuses allow detection of any artificial manipulation to cause sensing all ones.

In fabricating integrated circuits that are secured according to embodiments of the present invention, blowing efuses other than the always-blown efuses can be delayed until later in testing, including later blowing of efuses which distinguish between secure and non-secure modes. Initially with only the always-blown efuses blown, the security circuitry of an integrated circuit may be configured to set a security state of the integrated circuit to allow full test capability. Before parts are shipped further, to OEMs or to end users, additional security efuses can be blown to limit scan access to the integrated circuit. Because attacks that attempt to force security efuses to sense in an unblown state would also cause the always-blown efuses to sense as unblown, the attack would be detected when power is first applied to the integrated circuit, and security circuitry of the integrated circuit can then halt further power up sequencing and remain in blocked mode.

In view of these explanations, readers will recognize that securing an integrated circuit according to embodiments of the present invention provides the following benefits:

In fabrication testing, the status of always-blown efuses may be sensed and read even before any real efuses are blown.

Always-blown efuses may be used to distinguish between secure and non-secure modes, because attacks that attempt to force all efuses to sense in an unblown state would also cause the always-blown efuses to sense as unblown and thus block access to the integrated circuit.

There is no need for a WOP and therefore no special test sequence is needed to drive the WOP to blow always-blown efuses. Good integrated circuits will work immediately out of fabrication without any special test sequencing.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for securing an integrated circuit, the method comprising:
fabricating the integrated circuit so that the integrated circuit includes at least one efuse that is intended to be always blown during operation of the integrated circuit and the integrated circuit includes security circuitry capable of blowing the efuse and of performing other security related functions;
blowing, by the security circuitry of the integrated circuit, the efuse when power is applied to the integrated circuit and prior to performing any other security related functions.

2. The method of claim 1 wherein blowing the efuse further comprises blowing the efuse only if a test enable signal is asserted.

3. The method of claim 1 further comprising:
reading, by the security circuitry when power is applied to the integrated circuit, a sensed state of the efuse from a sensing circuit;
wherein blowing the efuse further comprises blowing the efuse only if the efuse is sensed as unblown.

4. The method of claim 1 wherein the other security related functions of the security circuitry include a capability of setting a security state of the integrated circuit according to a life cycle of the integrated circuit in dependence upon whether other efuses are blown.

5. The method of claim 1 wherein the integrated circuit is characterized by a multiplicity of security states, including a fabrication test security state, an original equipment manufacturer ('OEM') security state, a normal operations security state, a maintenance test security state, and a blocked security state.

6. The method of claim 1 wherein fabricating the integrated circuit further comprises fabricating the integrated circuit with no wafer-only pin ('WOP') to enable blowing the efuse after fabrication of the integrated circuit.

7. An integrated circuit comprising at least one efuse that is intended to be always blown during operation of the integrated circuit and security circuitry capable of:
blowing the efuse when power is applied to the integrated circuit and prior to performing any other security related functions.

8. The integrated circuit of claim 7 wherein blowing the efuse further comprises blowing the efuse only if a test enable signal is asserted.

9. The integrated circuit of claim 7 further comprising security capable of:
reading, by the security circuitry when power is applied to the integrated circuit, a sensed state of the efuse from a sensing circuit;
wherein blowing the efuse further comprises blowing the efuse only if the efuse is sensed as unblown.

10. The integrated circuit of claim 7 wherein the security circuitry is further capable of setting a security state of the integrated circuit according to a life cycle of the integrated circuit in dependence upon whether other efuses are blown.

11. The integrated circuit of claim 7 wherein the integrated circuit is characterized by a multiplicity of security states, including a fabrication test security state, an original equipment manufacturer ('OEM') security state, a normal operations security state, a maintenance test security state, and a blocked security state.

12. The integrated circuit of claim 7 wherein the integrated circuit is fabricated with no wafer-only pin ('WOP') to enable blowing the efuse after fabrication of the integrated circuit.

* * * * *